(12) United States Patent
Jung et al.

(10) Patent No.: US 7,288,364 B2
(45) Date of Patent: *Oct. 30, 2007

(54) TOP ANTI-REFLECTIVE COATING COMPOSITION AND METHOD FOR PATTERN FORMATION OF SEMICONDUCTOR DEVICE USING THE SAME

(75) Inventors: Jae Chang Jung, Seoul (KR); Cheol Kyu Bok, Icheon (KR); Sam Young Kim, Icheon (KR); Chang Moon Lim, Icheon (KR); Seung Chan Moon, Yongin (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 68 days.

This patent is subject to a terminal disclaimer.

(21) Appl. No.: 11/177,738

(22) Filed: Jul. 8, 2005

(65) Prior Publication Data

US 2006/0046184 A1    Mar. 2, 2006

(30) Foreign Application Priority Data

Aug. 31, 2004   (KR) .................... 10-2004-0069044

(51) Int. Cl.
*G03F 7/095* (2006.01)
*G03F 7/30* (2006.01)
(52) U.S. Cl. ................ 430/273.1; 430/311; 430/270.1
(58) Field of Classification Search ............... None
See application file for complete search history.

(56) References Cited

U.S. PATENT DOCUMENTS 5,879,853 A    3/1999  Azuma (Continued)

FOREIGN PATENT DOCUMENTS

JP    2003-167352    6/2003

(Continued)

OTHER PUBLICATIONS

Hagiwara et al "Characterization of TFE/norbornene-based fluoropolymer resist for 157-nm lithography", Advances in Resist Technology and Processing XXI, Proceedings of SPIE, Vo. 5376 (SPIE, Bellingham, WA, May 2004) pp. 159-168.*

(Continued)

*Primary Examiner*—Cynthia Hamilton
(74) *Attorney, Agent, or Firm*—Marshall, Gerstein & Borun LLP

(57) ABSTRACT

Disclosed herein is a top anti-reflective coating composition which comprises a photoacid generator represented by Formula 1 below.

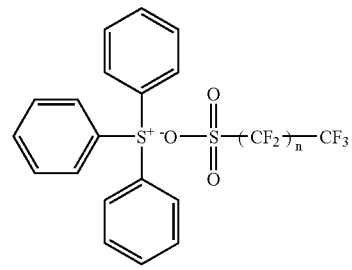

(1)

wherein n is between 7 and 25.

Since the top anti-reflective coating composition dissolves a portion of a photoacid generator present at the top of an underlying photosensitizer, particularly, upon formation of a top anti-reflective coating, it can prevent the top from being formed into a thick section. Therefore, the use of the anti-reflective coating composition enables the formation of a vertical pattern on a semiconductor device.

39 Claims, 3 Drawing Sheets

U.S. PATENT DOCUMENTS

| | | | |
|---|---|---|---|
| 6,057,080 A | 5/2000 | Brunsvold et al. | |
| 6,274,295 B1 | 8/2001 | Dammel et al. | |
| 2003/0108815 A1* | 6/2003 | Jung et al. | 430/273.1 |
| 2003/0219682 A1 | 11/2003 | Wakiya et al. | |
| 2004/0224525 A1* | 11/2004 | Endo et al. | 438/745 |
| 2004/0248033 A1* | 12/2004 | Yamazaki et al. | 430/270.1 |
| 2006/0063104 A1* | 3/2006 | Jung et al. | 430/270.1 |
| 2006/0127803 A1* | 6/2006 | Jung et al. | 430/270.1 |
| 2006/0127804 A1* | 6/2006 | Jung et al. | 430/270.1 |

FOREIGN PATENT DOCUMENTS

| | | |
|---|---|---|
| JP | 2004-054209 | 2/2004 |
| KR | 1020010001380 A | 1/2001 |
| KR | 10-2004-0008434 | 1/2004 |
| KR | 10-2005-0103789 | 11/2005 |
| KR | 10-2005-0113788 | 12/2005 |

OTHER PUBLICATIONS

Research Disclosure, No. 33701, "Highly Soluble, Thermally Stable Photoacid Initiators", anonymously submitted, May 1992, two pages.*

* cited by examiner

TOP ANTI-REFLECTIVE COATING COMPOSITION AND METHOD FOR PATTERN FORMATION OF SEMICONDUCTOR DEVICE USING THE SAME

BACKGROUND

1. Technical Field

The disclosure relates to an anti-reflective coating composition used in photolithography, which is a fabrication process for semiconductor devices, and a method for forming a pattern of a semiconductor device using the anti-reflective coating composition. More specifically, the disclosure relates to a top anti-reflective coating composition usable in immersion lithography for the fabrication of sub-50 nm semiconductor devices, and a method for forming a pattern of a semiconductor device using the top anti-reflective coating composition.

2. Description of the Related Art

Photolithography is a process for the transfer of a semiconductor circuit pattern formed on a photomask to a wafer, and is one of the most important processes in determining the fineness and integration density of circuits in the fabrication of semiconductor devices.

In recent years, as the integration density of semiconductor devices has increased, new techniques have been developed to adapt to the fine processing required in the fabrication of semiconductor devices. There is an increasing need for fine processing techniques in photolithography processes. As the circuit line widths are becoming finer and finer, the use of short-wavelength light sources for illumination and high numerical aperture lenses is required. Non-limiting examples of such short wavelength light sources are EUV, F2, ArF and KrF excimer lasers, listed in decreasing order of preference.

A number of studies on the development of sub-50 nm devices have been undertaken. Recent attention has been directed toward the development of suitable equipment and materials associated with the use of F2 and EUV as exposure light sources. Several issues arise from the use of EUV and F2 lasers as light sources. Technical solutions for the use of F2 are satisfactory to some extent. However, high-quality $CaF_2$ is difficult to produce on an industrial scale within a short time. Also, since soft pellicles are likely to be deformed upon exposure to light at 157 nm, the lifetime of the light source is short; hard pellicles incur considerable production costs, and are difficult to produce on a commercial scale due to the nature of light refraction. EUV lasers have their own drawbacks. Suitable light sources, exposure equipment and masks are required for EUV laser use, making their application impractical. Accordingly, the formation of finer high-precision photoresist patterns by using a photoresist adapted to the use of an ArF excimer laser is of importance.

Dry lithography is an exposure system wherein air is filled between an exposure lens and a wafer. In contrast to dry lithography, immersion lithography, which corresponds to an NA scaling technique, is an exposure system wherein water is filled between an exposure lens and a wafer. Since water (with a refractive index (n) of=1.4) is used as the medium for a light source in the immersion lithography, the NA is 1.4 times larger than that of dry lithography using air (refractive index (n)=1.0). Accordingly, immersion lithography is advantageous in terms of its high resolution.

A problem encountered with the fabrication of a sub-50 nm semiconductor device is that alteration of the critical dimension (CD) of a photoresist pattern inevitably occurs during the process for the formation of this ultrafine pattern. These alterations arise from standing waves, reflective notching, and diffracted and reflected light from an underlying layer due to the optical properties of the underlying layer on an overlying photoresist and due to the variation in the thickness of the photoresist. To prevent light from reflecting off the underlying layer, an anti-reflective coating is introduced between the photoresist and the underlying layer. The anti-reflective coating is composed of a material that absorbs light in the range of wavelengths used by the exposure light source. Previous treatments have placed this anti-reflective coating on the bottom, imposed between the undying layer and the photoresist. With the recent increase in the fineness of photoresist patterns, a top anti-reflective coating (TARC) has also been developed in order to prevent the photoresist pattern from being disrupted by the reflected and diffracted light. Specifically, as remarkable miniaturization of semiconductor devices makes photoresist patterns extremely fine, the use of a bottom anti-reflective coating alone cannot completely prevent the patterns from being disrupted by scattered reflection. Accordingly, a top anti-reflective coating is introduced to prevent the disruption of the patterns.

However, since conventional top anti-reflective coatings for use in dry lithography are water-soluble, they cannot be applied to immersion lithography. In other words, since water is used as a medium for a light source in immersion lithography, it easily dissolves the conventional top anti-reflective coatings. Accordingly, there is need for the development of a top anti-reflective coating for use in immersion lithography that is compatible with immersion lithography. This new top anti-reflective coating must satisfy the following requirements. The top anti-reflective coating must be transparent to a light source and have a refractive index between 1.5 and 1.65, depending on the kind of an underlying photosensitive film (i.e., photoresist) to be used. When the top anti-reflective coating composition is coated on an underlying photosensitive film, it must not dissolve the photosensitive film. The top anti-reflective coating must not be soluble in water upon light exposure, but must be soluble in a developing solution. Finally, the top anti-reflective coating must enable the formation of a vertical pattern for creation of the photoresist.

The abovementioned stringent requirements make the development of a suitable top anti-reflective coating for use in immersion lithography difficult. One of the sources of this difficulty arises from the conventional top anti-reflective coatings inability to allow for the desired formation of a photoresist pattern. Thus, there exists a strong need for the development of a top anti-reflective coating for use in immersion lithography which is water-insoluble and enables the formation of a vertical pattern upon formation of a semiconductor pattern.

SUMMARY OF THE DISCLOSURE

A top anti-reflective coating composition is disclosed which is water insoluble and, therefore, can be used in immersion lithography. Other desired properties of a top anti-reflective coating composition include its ability to prevent the multiple interference of light inside a photoresist in the formation of a photoresist pattern, its inhibition of any alteration in the dimensions of the photoresist pattern vaulting from the variation in the thickness of the photoresist and its ability to enable the formation of a vertical semiconductor pattern.

A method for forming a pattern of a semiconductor device using the top anti-reflective coating composition is also disclosed.

A disclosed top anti-reflective coating composition comprise a photoacid generator represented by Formula 1 below:

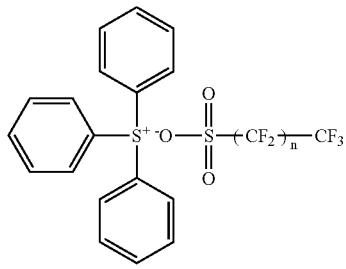

Formula 1 wherein n is between 7 to 25.

A disclosed method for forming a pattern of a semiconductor device comprise: (a) applying a photoresist to a semiconductor substrate on which a particular underlying structure is formed; (b) applying the top anti-reflective coating composition on top of the photoresist to form a top anti-reflective coating; and (c) exposing the photoresist to light, followed by developing to form a photoresist pattern.

DETAILED DESCRIPTION OF THE PRESENTLY PREFERRED EMBODIMENTS

Figure 1:
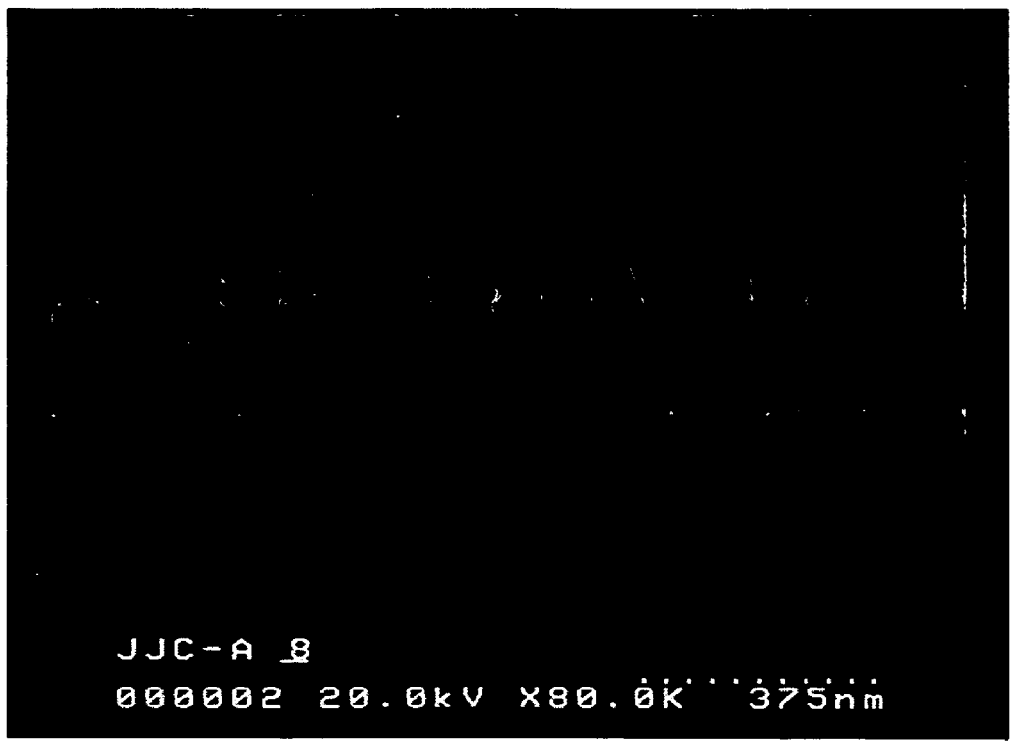
FIG. 1 is an 80 nm-L/S image of a semiconductor pattern formed using a top anti-reflective coating composition prepared in Comparative Example 1 of the disclosure.

The disclosure provides a top anti-reflective coating composition comprising a top anti-reflective coating polymer, a photoacid generator, and an organic solvent.

The top anti-reflective coating composition of the disclosure is characterized in the compound of Formula 1 is used as the photoacid generator.

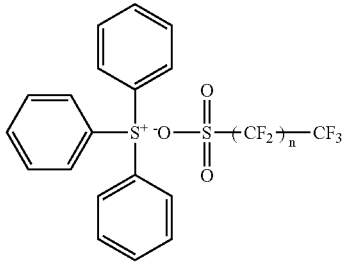

Formula 1 wherein n is between 7 and 25.

When n is lower than 7, a top anti-reflective coating to be formed using the composition of the disclosure is soluble in the immersion solution (e.g., water). This solubility causes the photoacid generator contained in the coating to precipitate, leading to contamination of the exposure lens. Meanwhile, when n is greater than 25, the molecular weight of the compound of Formula 1 is too high, and the acid is difficult to diffuse, causing problems in the subsequent developing step.

Accordingly, the range of n is preferably limited to about 7 to about 25. Since the compound of Formula 1 is not water-soluble and acts as a photoacid generator, it can be used to prepare a top anti-reflective coating composition suitable for immersion lithography. In addition, the top anti-reflective coating composition dissolves a portion of a photoacid generator present at the top of an underlying photosensitizer upon pattern formation, thus preventing the top from being formed into a thick section. A particularly preferred photoacid generator in the composition of the preset invention is triphenylsulfonium perflurooctane-sulfonate (n=7 in Formula 1).

The top anti-reflective coating composition of the disclosure comprises about 0.05 to about 5 wt % of the photoacid generator, based on the weight of the top anti-reflective coating polymer. When the content of the photoacid generator in the top anti-reflective coating composition is less than 0.05 wt %, the above-mentioned effects of the photoacid generator cannot be attained. However, when the content of the photoacid generator exceeds 5 wt %, a top anti-reflective coating to be formed absorbs light at 193 nm, significantly impairing the functions of the anti-reflective coating. Further, the amount of light entering an underlying photosensitizer is decreased and thus a higher exposure energy is required, resulting in lower productivity. Accordingly, the content of the photoacid generator in the top anti-reflective coating composition is preferably about 0.05 to about 5 wt %, based on the weight of the top anti-reflective coating polymer.

Examples of the top anti-reflective coating polymer contained in the top anti-reflective coating composition of the disclosure include polymers having high light transmission such that they can be used in the formation of top anti-reflective coatings. The top anti-reflective coating polymer is not restricted, as long as it is soluble in a developing solution after light exposure, thus having no effect on the formation of a pattern, and is water insoluble, thus enabling application to immersion lithography.

Examples of preferred top anti-reflective coating polymers include, for example:

poly(t-butylacrylate-acrylic acid-3-hydroxypropyl-methacrylate) of Formula 2 below:

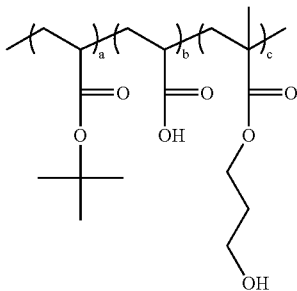

Formula 2 wherein a, b and c the mole fraction of each monomer and are in the range between about 0.05 to about 0.9, given that the sum of a, b and c equals one;

poly(t-butylacrylate-acrylic acid-N-isopropylacrylamide) of Formula 3 below.

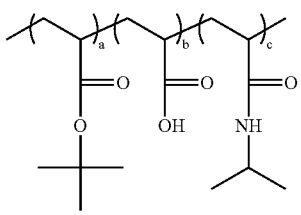

Formula 3 wherein a, b and c are as defined in Formula 2; and
poly(t-butylacrylate-acrylic acid-2-hydroxyethyl-methacrylate) of Formula 4 below.

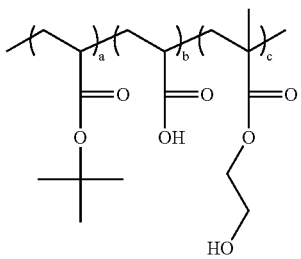

Formula 4 wherein a, b and c are as defined in Formula 2.

Organic solvents used in the top anti-reflective coating composition of the disclosure are not limited as long as they can dissolve the top anti-reflective coating polymer and the photoacid generator (e.g., triphenylsulfonium perfluorooctanesulfonate). n-Butanol is particularly preferred.

Considering the refractive index and thickness of the anti-reflective coating composition, n-butanol is preferably used in an amount of about 1,000 to about 10,000 wt %, based on the weight of the top anti-reflective coating polymer. If the amount of the n-butanol is outside this range, the reflective index of the anti-reflective coating falls outside the range of about 1.5 to about 1.65, and the thickness of the anti-reflective coating cannot be optimized.

The top anti-reflective coating composition of the disclosure may further comprise an acid diffusion inhibitor. The acid diffusion inhibitor is not limited as long as it can inhibit diffusion of an acid. L-proline is particularly preferred. The top anti-reflective coating composition of the disclosure may comprise about 1 to about 20 wt % of L-proline as the acid diffusion inhibitor, based on the weight of the top anti-reflective coating polymer. The acid diffusion inhibitor contained in the top anti-reflective coating composition acts to further inhibit the diffusion of an acid toward the unexposed region.

The top anti-reflective coating composition has an optimal reflective index of about 1.5 to about 1.65. Accordingly, when the top anti-reflective coating composition is overlaid on top of a photoresist, the reflectance can be minimized and thus the photoresist pattern can be protected from being disrupted by reflected light.

The disclosure also provides a method for forming a pattern of a semiconductor device comprising the steps of: (a) applying a photoresist to a semiconductor substance on which a particular underlying structure is formed; (b) applying the top anti-reflective coating composition on top of the photoresist to form a top anti-reflective coating; and (c) exposing the photoresist to light, followed by developing, to form a photoresist pattern.

The pattern formation method according to the disclosure is characterized in that the anti-reflective coating formed on top of the photoresist is formed using the top anti-reflective coating composition of the disclosure. Since the top anti-reflective coating thus formed has a reflective index of about 1.5 to about 1.65, the reflectance at the top of the photoresist can be minimized. Accordingly, the photoresist pattern formed by the method of the disclosure has greatly improved pattern uniformity.

According to the pattern formation method of the disclosure, baking may be carried out before and/or after light exposure. The baking is preferably carried out at about 70° C. to about 200° C.

The anti-reflective coating composition and the pattern formation method of the disclosure can be applied to a process for forming an ultrafine pattern using an ArF light source (193 nm). Likewise, they can be applied to a process for forming an ultrafine pattern using a light source (e.g., F2 or EUV) having a shorter wavelength, as long as water can be used as a medium for the light source. The light exposure using the light source is preferably achieved with an exposure energy of about 0.1 to about 50 mJ/cm$^2$.

In the pattern formation method of the disclosure, the developing step can be carried out using an alkaline developing solution. As a particularly preferred alkaline developing solution, a 0.01 to 5% (w/w) solution of tetramethylammoniumhydroxide (TMAH) in water is used.

The disclosure also provides the use of the top anti-reflective coating composition in the fabrication of a semiconductor device. Since the top anti-reflective coating composition of the disclosure can minimize scattered reflection, it can be applied to various processes for fabricating semiconductor devices, in addition to the formation process of an ultrafine pattern.

It can be appreciated that the top anti-reflective coating composition of the disclosure can be applied to a variety of processes in ways obvious to those skilled in the art, depending on the type of the process.

The disclosure will now be described in more detail with reference to the following examples. However, these examples are given for the purpose of illustration and are not to be construed as limiting the scope of the disclosure.

EXAMPLES

Comparative Example 1

Preparation of a Top Anti-reflective Coating Composition and Pattern Formation 2.5 g of poly(t-butylacrylate acid-3-hydroxypropylmethacrylate) was dissolved in 100 g of n-butanol to create a top anti-reflective coating composition for immersion lithography.

A photosensitizer (AR1221J, JSR) was coated to a thickness of 220 nm on a wafer, and baked at 130° C. for 90 seconds. The top anti-reflective coating composition was coated at 3,000 rpm on the photosensitizer, and baked at 90° C. for 60 seconds. After exposing the wafer to light using ArF exposure equipment, the exposed wafer was baked at 130° C. for 90 seconds and developed to form a pattern. An image of the pattern is show in FIG. 1. This image shows that the pattern was formed in a slight 't-top' shape.

Example 1

Preparation of a Top Anti-reflective Coating Composition and Pattern Formation 2.5 g of poly(t-butylacrylate-acrylic acid-3-hydroxypropylmethacrylate) and 0.15 g of triphenylsulfonium perfluorooctanesulfonate (Formula 5) were dissolved in 100 g of n-butanol to create a top anti-reflective coating composition for immersion lithography.

Formula 5

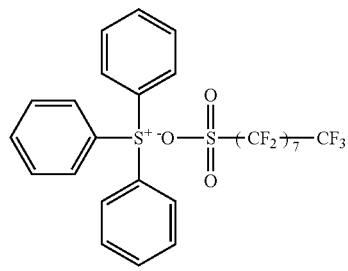

Figure 2:
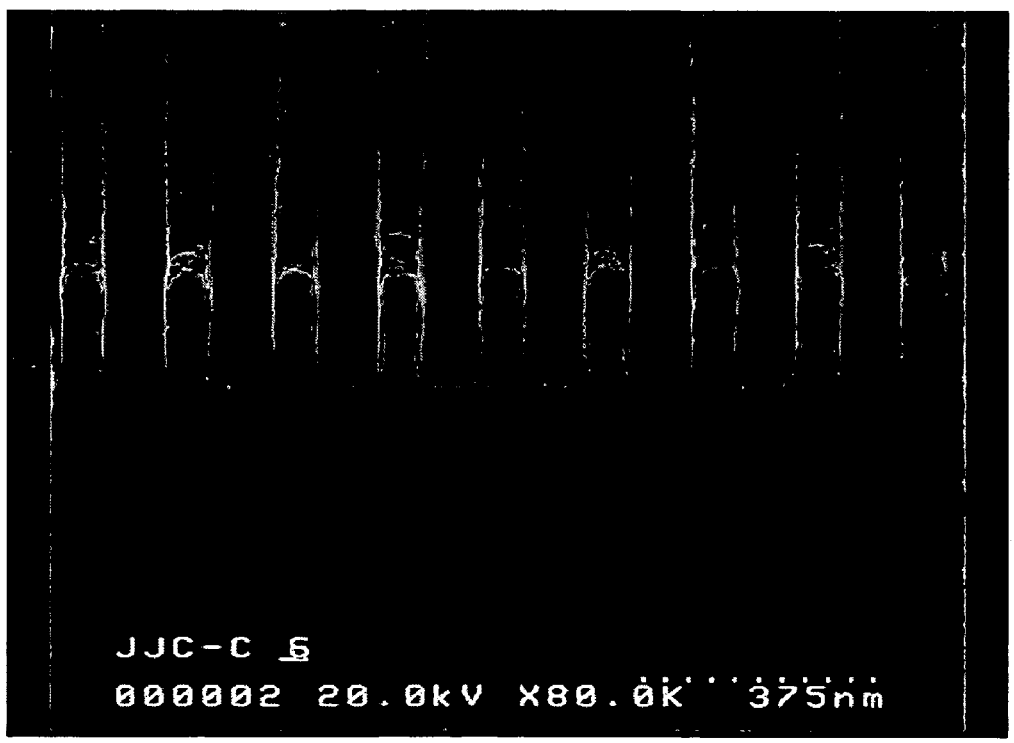
FIG. 2 is an 80 nm-L/S image of a semiconductor pattern formed using a top anti-reflective coating composition prepared in Example 1 of the disclosure.

A photosensitizer (AR1221J, JSR) was coated to a thickness of 220 nm on a wafer, and baked at 130° C. for 90 seconds. The top anti-reflective coating composition was coated at 3,000 rpm on the photosensitizer, and baked at 90° C. for 60 seconds. After exposing the wafer to light using ArF exposure equipment, the exposed wafer was baked at 130° C. for 90 seconds and developed to form a pattern. An image of the pattern is shown in FIG. 2. This image indicates that the pattern was vertically formed when compared to the pattern formed in Comparative Example 1 (see FIG. 1).

Comparative Example 2

Preparation of a Top Anti-reflective Coating Composition and Pattern Formation A top anti-reflective coating composition was prepared in the same manner as in Comparative Example 1, except that poly(t-butylacrylate acid-N-isopropylacrylamide) was used as a top anti-reflective coating polymer. Further, a pattern was formed using the top anti-reflective coating composition in the same manner as in Comparative Example 1.

Figure 3:
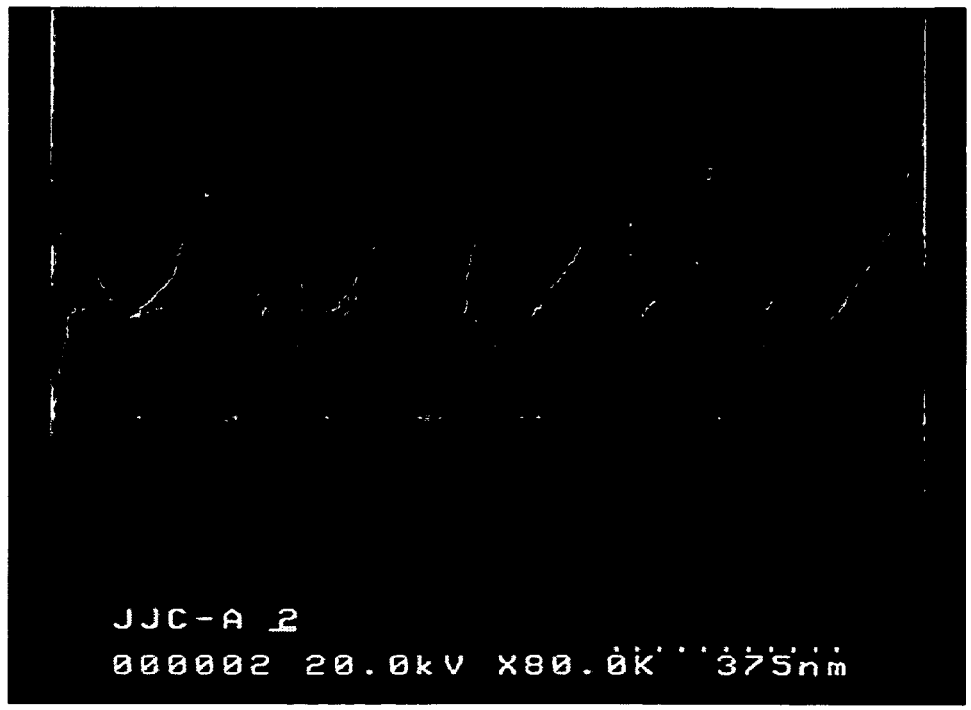
FIG. 3 is an 80 nm-L/S image of a semiconductor pattern formed using a top anti-reflective coating composition prepared in Comparative Example 2 of the disclosure.

An image of the pattern thus formed is shown in FIG. 3. This image shows that the pattern was formed in a slight 't-top' shape.

Example 2

Preparation of a Top Anti-reflective Coating Composition and Pattern Formation A top anti-reflective coating composition was prepared in the same manner as in Example 1, except that poly(t-butylacrylate-acrylic acid-N-isopropylacrylamide) was used as a top anti-reflective coating polymer. Further, a pattern was formed using the top anti-reflective coating composition in the same manner as in Example 1.

Figure 4:
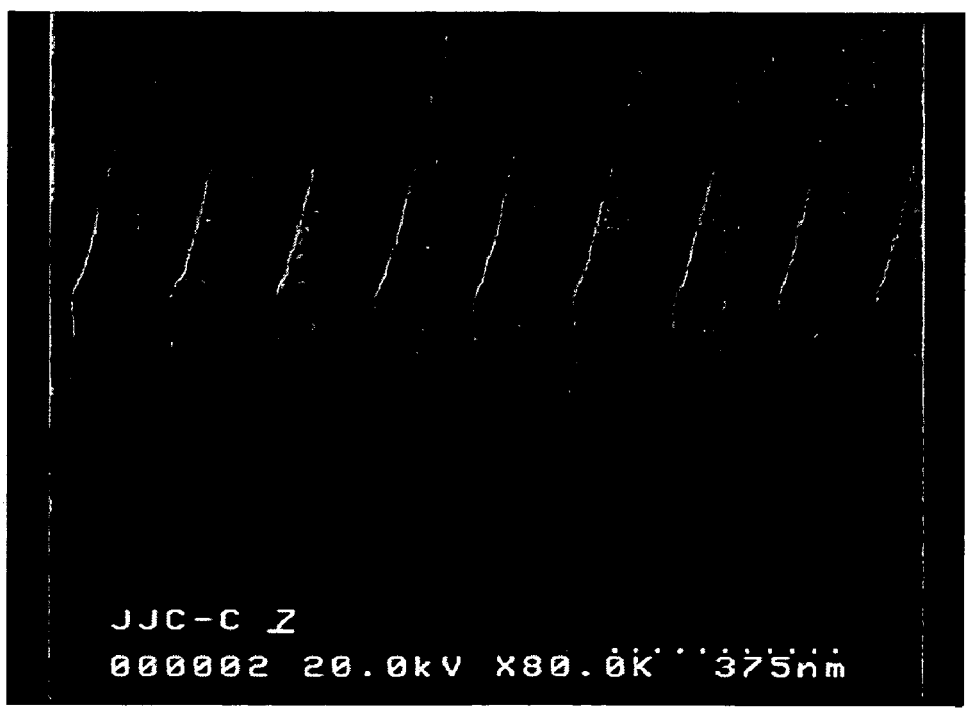
FIG. 4 is an 80 nm-L/S image of a semiconductor pattern formed using a top anti-reflective coating composition prepared in Example 2 of the disclosure.

An image of the pattern thus formed is shown in FIG. 4. This image indicates that the pattern was vertically formed when compared to the pattern formed in Comparative Example 2 (see FIG. 3).

Comparative Example 3

Preparation of a Top Anti-reflective Coating Composition and Pattern Formation A top anti-reflective coating composition was prepared in the same manner as in Comparative Example 1, except that poly(t-butylacrylate-acrylic acid-2-hydroxyethylmethacrylate) was used as a top anti-reflective coating polymer. Further, a pattern was formed using the top anti-reflective coating composition in the same manner as in Comparative Example 1.

Figure 5:
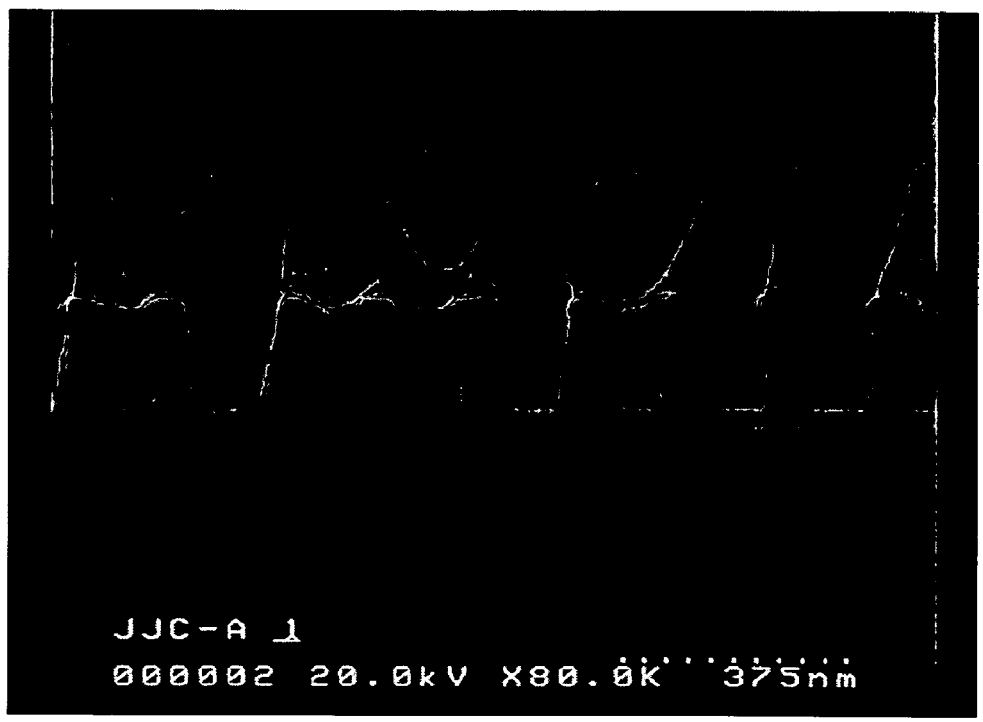
FIG. 5 is an 80 nm-L/S image of a semiconductor pattern formed using a top anti-reflective coating composition prepared in Comparative Example 3 of the disclosure.

An image of the pattern thus formed is shown in FIG. 5. This image shows that the pattern was formed in a slight 't-top' shape.

Example 3

Preparation of a Top Anti-reflective Coating Composition and Pattern Formation A top anti-reflective coating composition was prepared in the same manner as in Example 1, except that poly(t-butylacrylate-acrylic acid-2-hydroxyethylmethacrylate) was used as a top anti-reflective coating polymer. Further, a pattern was formed using the top anti-reflective coating composition in the same manner as in Example 1.

Figure 6:
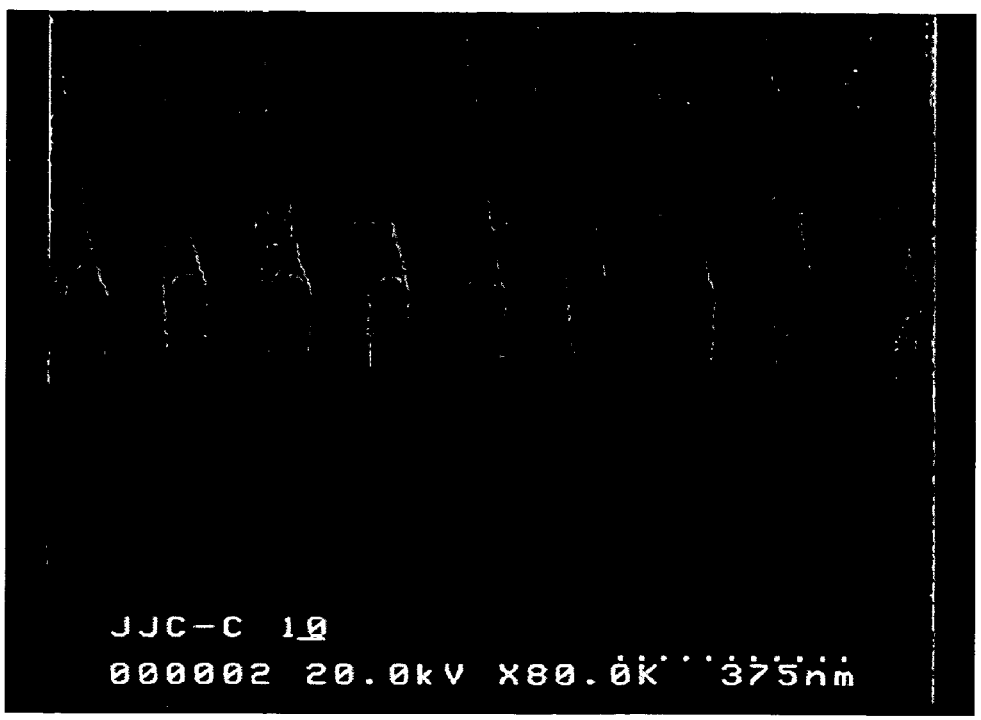
FIG. 6 is an 80 nm-L/S image of a semiconductor pattern formed using a top anti-reflective coating composition in Example 3 of the disclosure.

An image of the pattern thus formed is shown in FIG. 6. This image indicates that the pattern was vertically formed when compared to the pattern formed in Comparative Example 3 (see FIG. 5).

As apparent from the above description, the top anti-reflective coatings formed using the anti-reflective coating compositions of the disclosure allow for better-quality results from immersion lithography over those compositions and coating previously disclosed. Since the top anti-reflective coating has a light transmission of 96% or higher, it is transparent to a light source. The top anti-reflective coatings have a refractive index between about 1.5 and about 1.65. The top anti-reflective coating compositions do not dissolve the underlying photosensitizer. The top anti-reflective coatings are not soluble in water upon light exposure, but are soluble in the developing solution. All of these properties enable for the formation of a vertical pattern on a photoresist, without alterations to the ultrafine pattern.

Further advantages arise from the fact that the top anti-reflective coating composition of the disclosure dissolves a portion of the photoacid generator present at the top of an underlying photosensitizer. Upon formation of a top anti-reflective coating, it can prevent the top from being formed into a thick section.

Accordingly, the top anti-reflective coating formed using the anti-reflective coating composition of the disclosure can be applied to immersion lithography, and can decrease the reflectance at the top of the photoresist, thereby minimizing the alteration of CD.

Since the top anti-reflective coating composition of the disclosure enables the formation of a fine photoresist pattern, it contributes to the fabrication of sub-50 nm semiconductor devices in an efficient manner.

Although the preferred embodiments have been disclosed for illustrative purposes, those skilled in the art will area that various modifications, additions and substitutions are possible, without departing from the scope and spirit of this disclosure and the accompanying claims.

What is claimed is:

1. A top anti-reflective coating composition, comprising:
   a top anti-reflective coating polymer selected from the group consisting of:
   poly(t-butylacrylate-acrylic acid-3-hydroxypropyl-methacrylate) of Formula 1 below:

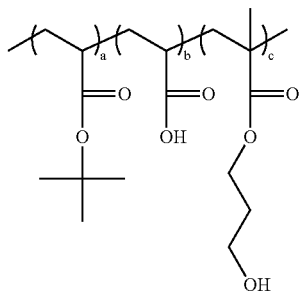

(1)

wherein a, b and c represent the mole fraction of each monomer and are in the range between about 0.05 and about 0.9, and the sum of a, b, and c equals one;
poly(t-butylacrylate-acrylic acid-N-isopropylacrylamide) of Formula 2 below:

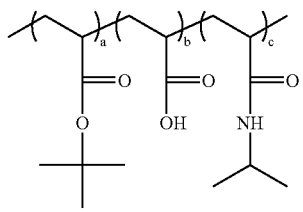

(2)

wherein a, b and c are as defined in Formula 1; and,
poly(t-butylacrylate-acrylic acid-2-hydroxyethyl-methacrylate) of Formula 3 below:

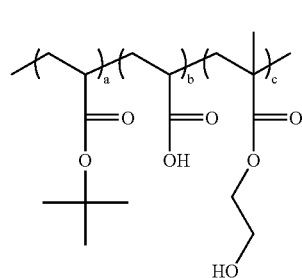

(3)

wherein a, b and c are as defined in Formula 1;
a photoacid generator represented by Formula 4 below:

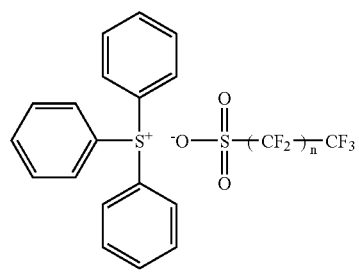

(4)

wherein n is between 7 and 25; and,
an organic solvent.

2. The composition according to claim 1, wherein the photoacid generator of Formula 4 is triphenylsulfonium perfluorooctanesulfonate.

3. The composition according to claim 1, wherein the composition comprises about 0.05 to about 5 wt % of the photoacid generator, based on the weight of the top anti-reflective coating polymer.

4. The composition according to claim 1, wherein the organic solvent is a primary alcohol.

5. The composition according to claim 4, wherein the primary alcohol is n-butanol.

6. The composition according to claim 5, wherein the composition is prepared by dissolving the top anti-reflective coating polymer in about 1,000 to about 10,000 wt % of n-butanol, based on the weight of the polymer.

7. The composition according to claim 1, further comprising an acid diffusion inhibitor.

8. The composition according to claim 7, wherein the acid diffusion inhibitor is L-proline.

9. The composition according to claim 8, wherein the composition comprises about 1 to about 20 wt % of L-proline, based on the weight of the top anti-reflective coating polymer.

10. The composition according to claim 1, wherein the composition has a refractive index between about 1.5 and about 1.65.

11. A semiconductor device comprising the top anti-reflective coating composition of claim 1.

12. A method for forming a pattern of a semiconductor device, comprising:
    (a) applying a photoresist to a semiconductor substrate on which an underlying structure is formed;
    (b) applying a top anti-reflective coating composition on top of the photoresist to form a top anti-reflective coating;

(c) exposing the photoresist to light; and,
(d) developing the photoresist to form a photoresist pattern;
wherein the top anti-reflective coating composition comprises:
a top anti-reflective coating polymer;
a photoacid generator represented by Formula 5 below:

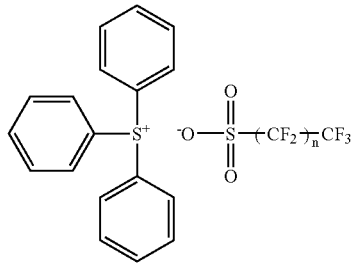

(5)

wherein n is between 7 and 25; and,
an organic solvent.

13. The method according to claim 12, further comprising baking the substrate before and/or after the exposure.

14. The method according to claim 13, wherein the baking is carried out in the range of about 70° C. to about 200° C.

15. The method according to claim 12, wherein water is used as a medium for the light source in the exposure.

16. The method according to claim 12, wherein the development is carried out using a 0.01 to about 5% (w/w) solution of tetramethylammoniumhydroxide (TMAH) in water as a developing solution.

17. A top anti-reflective coating composition, comprising:
a top anti-reflective coating polymer;
a photoacid generator represented by Formula 6 below:

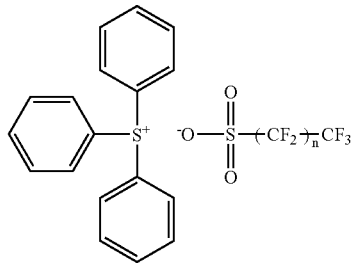

(6)

wherein n is between 7 and 25; and,
a primary alcohol organic solvent.

18. The composition according to claim 17, wherein the photoacid generator of Formula 6 is triphenylsulfonium perfluorooctanesulfonate.

19. The composition according to claim 17, wherein the composition comprises about 0.05 to about 5 wt % of the photoacid generator, based on the weight of the top anti-reflective coating polymer.

20. The composition according to claim 17, wherein the primary alcohol is n-butanol.

21. The composition according to claim 20, wherein the composition is prepared by dissolving the top anti-reflective coating polymer in about 1,000 to about 10,000 wt % of n-butanol, based on the weight of the polymer.

22. The composition according to claim 17, further comprising an acid diffusion inhibitor.

23. The composition according to claim 22, wherein the acid diffusion inhibitor is L-proline.

24. The composition according to claim 23, wherein the composition comprises about 1 to about 20 wt % of L-proline, based on the weight of the top anti-reflective coating polymer.

25. A semiconductor device comprising the top anti-reflective coating composition of claim 17.

26. A top anti-reflective coating composition, comprising:
a top anti-reflective coating polymer;
a photoacid generator represented by Formula 7 below:

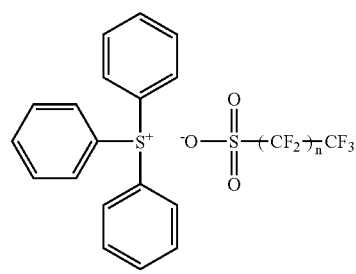

(7)

wherein n is between 7 and 25; and,
an organic solvent;
wherein the composition comprises about 0.05 to about 5 wt % of the photoacid generator, based on the weight of the top anti-reflective coating polymer.

27. The composition according to claim 26, wherein the photoacid generator of Formula 7 is triphenylsulfonium perfluorooctanesulfonate.

28. The composition according to claim 26, wherein the organic solvent is n-butanol.

29. The composition according to claim 28, wherein the composition is prepared by dissolving the top anti-reflective coating polymer in about 1,000 to about 10,000 wt % of n-butanol, based on the weight of the polymer.

30. The composition according to claim 26, further comprising an acid diffusion inhibitor.

31. The composition according to claim 30, wherein the acid diffusion inhibitor is L-proline.

32. The composition according to claim 31, wherein the composition comprises about 1 to about 20 wt % of L-proline, based on the weight of the top anti-reflective coating polymer.

33. A semiconductor device comprising the top anti-reflective coating composition of claim 26.

34. A top anti-reflective coating composition, comprising:
a top anti-reflective coating polymer;
a photoacid generator represented by Formula 8 below:

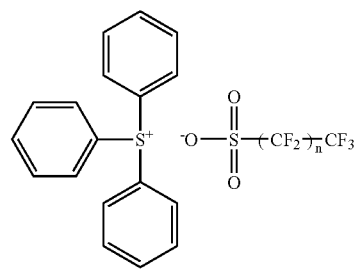

(8)

wherein n is between 7 and 25;
an organic solvent; and,
L-proline as an acid diffusion inhibitor.

35. The composition according to claim 34, wherein the photoacid generator of Formula 8 is triphenylsulfonium perfluorooctanesulfonate.

36. The composition according to claim 34, wherein the organic solvent is n-butanol.

37. The composition according to claim 36, wherein the composition is prepared by dissolving the top anti-reflective coating polymer in about 1,000 to about 10,000 wt % of n-butanol, based on the weight of the polymer.

38. The composition according to claim 34, wherein the composition comprises about 1 to about 20 wt % of L-proline, based on the weight of the top anti-reflective coating polymer.

39. A semiconductor device comprising the top anti-reflective coating composition of claim 34.

* * * * *